United States Patent [19]

Shan et al.

[11] Patent Number: 5,296,094

[45] Date of Patent: Mar. 22, 1994

[54] PROCESS FOR ETCHING SILICON DIOXIDE LAYER WITHOUT MICRO MASKING EFFECT

[75] Inventors: Hongging Shan, San Jose; Donald W. Jillie, Jr., Cupertino, both of Calif.

[73] Assignee: Intel Corporation, Santa Clara, Calif.

[21] Appl. No.: 897,768

[22] Filed: Jun. 12, 1992

[51] Int. Cl.$^5$ .............. H01L 21/00; H01L 21/02; B44C 1/22; C03C 15/00
[52] U.S. Cl. .................. 156/651; 156/625; 156/650; 437/225; 437/228
[58] Field of Search .............. 156/625, 650, 651; 437/225, 228

[56] References Cited

U.S. PATENT DOCUMENTS 4,511,430 4/1985 Chen et al. .................. 156/646

OTHER PUBLICATIONS

Howard Leung, "Introducing the Precision Etch 8310 Molecular Backside Cooling (MBC) Capability", Applied CVD and Etch Technologies in Review, Spring 1990, pp. 12–16.

Primary Examiner—Brian E. Hearn
Assistant Examiner—B. Everhart
Attorney, Agent, or Firm—Blakely Sokoloff Taylor & Zafman

[57] ABSTRACT

A process for etching a silicon dioxide layer is disclosed. The novel two step etch process is used, for example, to perform a contact etch through a BPSG layer. Both etch steps are carried out in a flow of $O_2$ and $CHF_3$. In the first step, a high flow rate of oxygen (approximately 19 SCCM) is used. During this step, the bulk of the oxide is removed, without the problem of micro masking wherein small localized regions remain partially un-etched. In the second step, the remaining oxide is removed in a lower $O_2$ flow rate, giving good oxide to silicon selectivity.

28 Claims, 5 Drawing Sheets

PROCESS FOR ETCHING SILICON DIOXIDE LAYER WITHOUT MICRO MASKING EFFECT

BACKGROUND OF THE INVENTION

1. Field Of The Invention

This invention relates to the field of semiconductor device fabrication and more specifically to a process designed to etch contact openings or vias in an insulative layer.

2. Prior Art

In the manufacture of semiconductor devices, there is a need to make electrical contact to certain regions of the device. For example, in a wide variety of devices such as MOS transistors, EPROMS, capacitors, etc., electrical contact must be made to various regions including diffusion regions in the semiconductor substrate such as source or drain diffusions, and polysilicon gates. In addition, it is usually necessary to make electrical contact to other structures of the device as well, for example, to the first metalization. Normally, the regions which must be contacted are completely covered with a dielectric layer during fabrication which is deposited to provide electrical isolation. Electrical contact is made to the above described regions by first forming an opening in the dielectric over the contact region or metal layer and next filling the opening with a conductive material. The openings can be filled in the same step in which interconnects are formed, for example, by depositing a blanket layer of aluminum, forming a masking layer to cover the openings, as well as the regions which will become interconnects, and then etching the exposed aluminum. The above described processing fills the opening with aluminum and forms interconnects which are necessary for functioning of the device. Alternatively, the opening can be filled in a separate process followed by aluminium deposition, masking, and etch to form interconnects which contact the fill material.

Generally, when etching an opening in a dielectric layer overlying a contact region such as a source, drain, or gate, the process is referred to as the "contact etch", and the openings thus formed are called contact openings. When etching an opening in a dielectric layer overlying, for example, a metal layer to be contacted, the process is referred to as the "via etch", and the openings thus formed are called vias.

Various types of insulative layers are formed at several different process steps during fabrication. Thermal oxide of approximately 5000–6000 Å is grown as field isolation relatively early in the processing. Later, a gate oxide is formed. Then, through a sequence of steps, the gate is formed and diffusion regions are defined within the substrate. Next, a borophosphosilicate glass (BPSG) inter-level dielectric layer is deposited on the substrate. It is through this BPSG layer which the contact openings must be made. It addition to the BPSG layer, there may be other oxide layers overlying the contact regions. For example, the source and drain may still be covered with the gate oxide, a pad oxide layer, or a sacrificial oxide layer. In CMOS devices, there may be a low temperature oxide (LTO) between the contact regions and the BPSG layer to prevent counter-doping. If any of these other oxides are present, they are etched in the same step as the BPSG layer. Generally, these layers are much thinner than the BPSG layer. In the present discussion, it will be assumed that the BPSG layer is deposited directly on the contact region. However, the presence of these additional layers will not affect the practice of the present invention as described herein.

In order to form the contact openings, a masking material such as photoresist is formed over the entire BPSG layer. The resist is patterned by well known methods to expose openings in the BPSG layer over the contact regions. Additionally, the BPSG layer is exposed in other regions, such as in the scribe lines between die and, for example, portions of the mask alignment mark region to allow for alignment with subsequent layers. Next, the dielectric layer is etched in the exposed regions to form the contact openings.

In the prior art, various dry etching processes are used to etch the oxide. Although oxide can be wet etched in a solution containing hydrofluoric acid (HF), dry processes are preferred since they are non-intrusive (since the wafers do not need to be submerged in an acid solution) and do not have the undercutting problems associated with wet etches. Nearly all modern processes use dry etches or wet/dry etches to etch oxide layers. The dry processes are carried out by plasma etching or reactive ion etching (RIE). Typical gasses used in dry processes include oxygen and various halocarbons, particularly chloro and/or fluoro carbons such as $CHF_3$ (Freon 23), $C_3F_8$, $C_2F_6$, and $CF_4$. Other halogenated compounds such as $NF_3$, $SF_6$, $SiF_4$, and $SiF_2$ may also be used. In addition, other gasses such as $A_r$, $He$, $N_2$, $H_2$, $Cl_2$ and $F_2$ are often added to the gas flow. The particular gas mixture used will depend on, for example, the characteristics of the oxide being etched, the stage of processing, the etch tool being used, the desired etch characteristics such as etch rate, wall slope, anisotropy, etc.

One problem with the above-mentioned dry etching processes for etching oxides is the occurrence of the "micro masking" effect. This effect occurs most commonly when etching a BPSG layer in a dry process, and occurs mostly in large open sites on the wafer. Generally, very little micro masking occurs in the contact openings. Although the exact cause of the phenomena is not known, is believed that during the plasma etch some cross-linking occurs to form a polymer on the surface of the BPSG layer which is resistant to the etch. FIG. 1 shows an example of the result of a prior art dry etching process. FIG. 1 shows the top view of a portion of a semiconductor substrate after BPSG deposition, masking, and etch. In the contact regions where the contact openings will be formed (not shown in FIG. 1), the BPSG is deposited directly on top of the contact regions, for example, directly on top of a source region. In the region shown in FIG. 1, the BPSG film is deposited on top of a thermal oxide. The inner region 10 was left unmasked in order to etch all BPSG from region 10 as well as some of the underlying thermal oxide. The outer region 11 is unetched BPSG which was masked by photoresist during the etching process. As can be seen, within inner region 10 there are a plurality of micro masking defects 15. Each micro masking defect 15 has a diameter of approximately 0.5 microns and a height of approximately 0.2–0.3μ. However, the size and the shape of the micro masking defects 15 can vary.

Surrounding the micro masking defects 15 is a clear surface 16 of underlying oxide which has been completely cleared of the BPSG layer during the etch. Usually, the inner region 10 of an open site such as that shown in FIG. 1 would be used to measure the total oxide thickness removed, in order to determine etch rates and to ensure adequate overetch. Region 10 is used since the contact openings themselves are too small in diameter to permit measurement of remaining oxide in those regions. Also, since the BPSG is on top of a relatively thick thermal oxide in the open regions shown in FIG. 1, overetch can be determined. That is, by measuring the remaining oxide in region 10, the amount of thermal oxide removed after the BPSG layer has been removed can be determined, giving an indication of the extent of overetch of the BPSG layer.

The micro masking problem illustrated in FIG. 1 causes several problems. The presence of a large number of micro masking defects 15 causes light to be reflected randomly or scattered from the surface. Because of this scattering, film thickness of the remaining oxide in region 10 cannot be determined accurately. This is due to the fact that analytical instruments for measuring film thickness shine an optical beam through the film and measure the intensity of the reflected beam to determine film thickness. Since the remaining film thickness in these areas cannot be measured, on-line determination of the amount of oxide removed, and the etch rate cannot be made. The lack of on-line measurement is a serious detriment as process control is much more difficult without the availability of on-line data with which to control the process. Finally, the micro masking defects 15 make surface features harder to see through a microscope such as an alignment microscope. Thus, alignment of subsequent layers is more difficult due to the presence of the micro masking defects 15.

What is needed is a process to etch a BPSG layer from contact openings which does not create micro masking defects in large open areas so that film thickness can be measured reliably, etch parameters can be measured on-line, and alignment to subsequent layers is not impeded.

SUMMARY OF THE INVENTION

A process for etching an oxide layer during fabrication of a semiconductor device is disclosed. The invented process can be used for example, to form contact openings in a BPSG layer. The invented process avoids the micro masking problem of prior art processes wherein small, roughly circular regions of BPSG remain un-etched in large open sites on the substrate.

The preferred process includes a two step reactive ion etch (RIE) in oxygen and CHF$_3$. The first step is carried out in a high flow of oxygen compared with prior art processes. The use of high oxygen flow has been found to eliminate micro masking in large open sites. The second step uses a lower oxygen flow, which provides for better oxide/silicon selectivity, allowing for an adequate overetch without excessive etch of the underlying silicon in the contact regions.

DETAILED DESCRIPTION OF THE PREFERRED EMBODIMENT

A novel process is described for etching a silicon dioxide (SiO$_2$) layer during the fabrication of the semiconductor device without the micro masking effect. In the following description, numerous specific details are set forth such as specific thicknesses, etching parameters, etc. in order to provide a thorough understanding of the present invention. It will be obvious, however, to one skilled in the art, that the present invention may be practiced without these specific details. In other instances, well known process steps have not been described in detail in order to avoid unnecessarily obscuring the present invention. In addition, although in the following description the invented process is used to etch contact openings in a borophosphosilicate glass (BPSG) layer, it will be obvious to one skilled in the art that the invented process can be used to etch other oxide layers, such as essentially pure SiO$_2$, phosphosilicate glass (PSG), and similar oxide layers. Also, although the present invention is described at the contact etch step, it will be obvious to one skilled in the art that the invented process can be used to etch oxide layers at other stages during the fabrication of the device.

Figure 2:
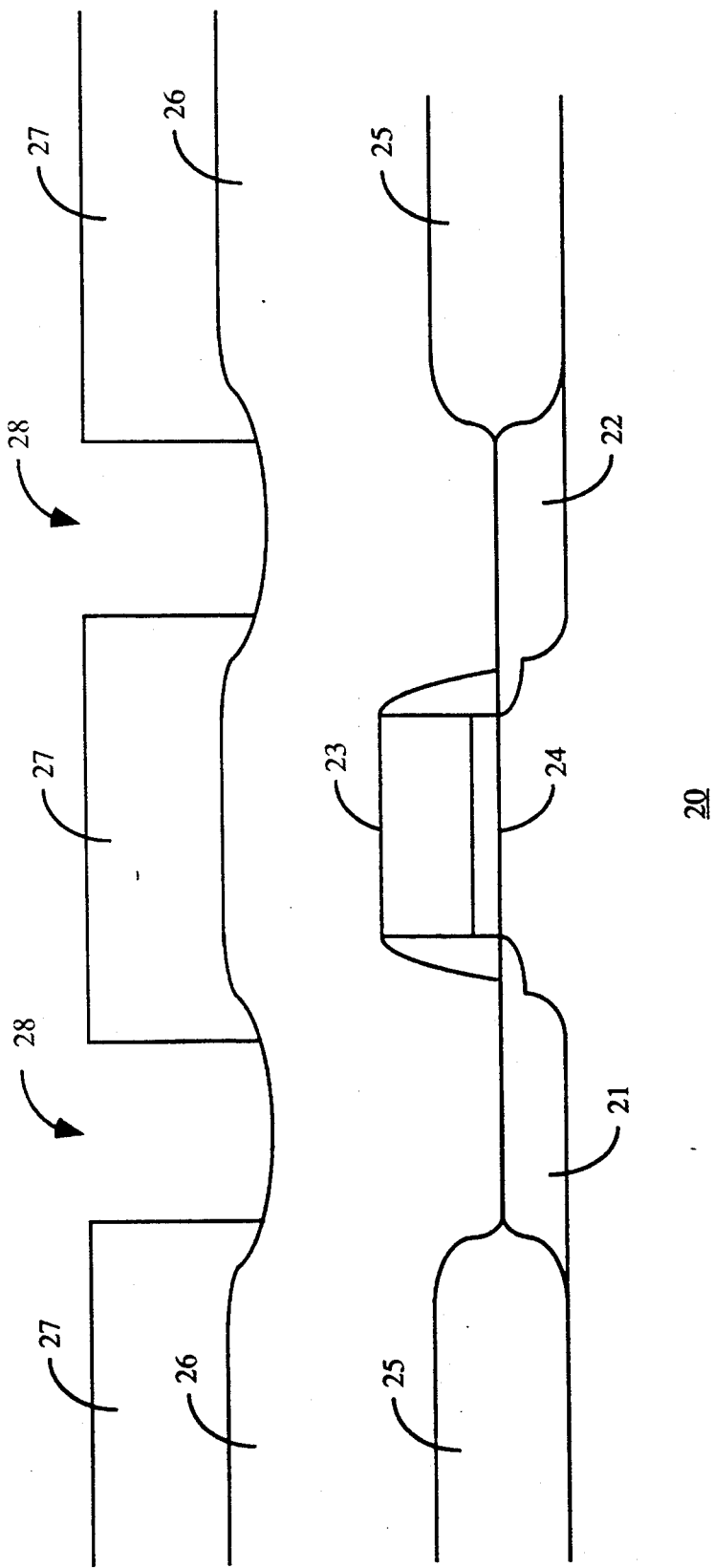
FIG. 2 shows a cross sectional elevation view of a semiconductor device illustrating the regions to be etched by the process of the present invention.

FIG. 2 shows an example of a device at a stage of fabrication where the present invention may be practiced. The device shown in FIG. 2 may be, for example, an MOS transistor. The device, fabricated on silicon substrate 20, comprises source 21, drain 22, gate 23, and gate oxide 24. Also shown is thermal oxide 25 and BPSG layer 26. Generally, the thickness of thermal oxide 25 is in the range of approximately 5000-6000 Å. The thickness of BPSG layer 26 is in the range of approximately 7500-15,000 Å. (0.75-1.5$\mu$). The thickness of BPSG to be etched will vary from location to location due to non-uniformities in the deposition process and differences in surface topography. For example, in some regions, such as where contact is being made to a polysilicon gate, the structure is raised and the BPSG overlying the raised structure will have a lesser thickness. Also shown in FIG. 2 is patterned photoresist layer 27. Photoresist layer 27 has a thickness in the range of approximately 1-2$\mu$. The structure of FIG. 2 is fabricated by well known methods. It will be appreciated by one skilled in the art that the exact device type, dopant types and concentrations, and thicknesses of the various layers are not critical to the practice of the present invention as described below.

FIG. 2 shows openings 28 in the photoresist layer 27 which are located over regions where the contact opening through BPSG layer 26 will be formed. As can be seen, once an opening is etched through BPSG layer 26 underneath opening 28, a portion of source 21 and drain 22 will be exposed, allowing for contact to a subsequent metalization layer. In addition to the openings 28 shown in FIG. 2, there will be many more such openings in photoresist layer 27 in order to make contact to, for example, the source and drain regions of other devices, as well as to other regions. For example, contact to gate 23 or to a metalization layer through BPSG layer 26 may be made at other portions of substrate 20 not shown in FIG. 2. Additionally, there will be large open sites, such as near the alignment marks, and in other regions, including regions where the thickness of oxide remaining after etch will be measured, which will remain uncovered by photoresist layer 27 during the etch.

In many current devices, the contract region such as source 21 and drain 22 are submicron (less than 1 micron). Thus, the contact opening must also have a dimension less than 1 micron. This in turn requires that the openings 28 in photoresist layer 27 be less than 1 micron. In general, the dimension of the openings 28 is in the range of approximately 0.5–1.0 micron. The opening formed after the etch process described below will generally have a slightly larger or smaller dimension than the opening 28 of photoresist layer 27.

There are several important requirements a contact etch must satisfy. The etch process must have a high enough etch rate to allow for a low enough throughput time to be used in a production process. Additionally, the etch process must ensure that all BPSG is removed from the contact regions such as source 21 and drain 22 so that electrical contact can be made to these regions. In order to ensure complete etching, a slight overetch is usually employed. The overetch cannot be too extensive, however, because silicon regions such as source 21 and drain 22, as well as any polysilicon regions being contacted, can be damaged to the point where the device is no longer functional if etched too extensively. For example, if the overetch is too extensive, the contact regions may become pitted, thereby preventing reliable electrical contact to a subsequent metalization layer. In order to ensure completely removal of oxide from the contact region without too extensive an overetch, it is necessary to be able to measure the etch rate or total oxide removal accurately. As described above, large open non-active sites such as those shown in FIG. 1 where BPSG layer 26 overlies thermal oxide layer 25 are ideal locations to measure the thickness of the oxide removed by the etch. Since the BPSG layer 26 is over another oxide layer, the total oxide thickness beyond the thickness of BPSG layer 26 removed during the oxide removed by the etch can be determined. Therefore, the total overetch can be determined. In contrast to the contact openings 28 described above, these measurement sites are quite large, (approximately 100–200μ by 100–200μ or larger).

It is also desirable that the etch process has a high oxide etch rate to silicon etch rate ratio, so that the underlying silicon layer is not too severely etched during the overetch. In the present specification, the term silicon encompasses all types of silicon, including single crystal silicon, and polycrystalline silicon, whether doped or undoped. In this regard, in processes utilizing oxygen and chloro/fluorocarbons, it is known that the silicon etch rate increases as the percentage of oxygen in the gas flow increases at a greater rate than the oxide etch rate increase. Therefore, in order to keep the etch selective, the oxygen flow rate is kept relatively low in prior art process.

Figure 3:
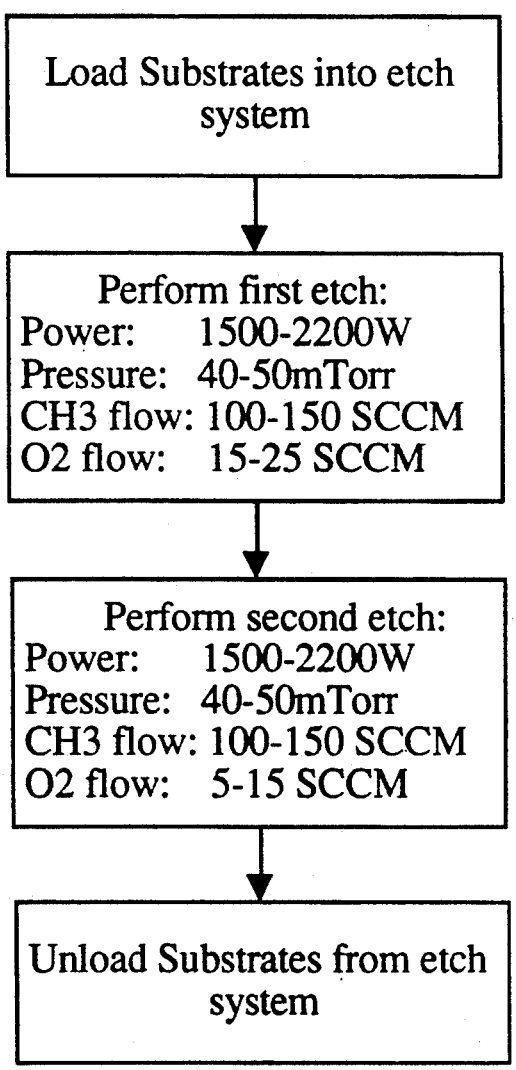
FIG. 3 is a flow chart of the currently preferred embodiment of the present invention.

FIG. 3 shows a flow chart of the currently preferred embodiment of the present invention. In the first step shown in FIG. 3, a substrate is loaded into the etch system. The etch system is then pumped down to a level of approximately $10^{-4}$ torr. In the currently preferred embodiment, a hexode reactor in RIE mode, such as the applied materials AME 8310, is used. It will be appreciated that other plasma or RIE etch systems can be utilized to practice the present invention. If other systems are used, some optimization of the operating parameters given below may be necessary to achieve the beneficial results of the present invention.

In the following description, a two step etch process using oxygen and $CHF_3$ (Freon 23) is described. It will be appreciated by one skilled in the art, however, that the teachings of the present invention can be applied to eliminate the micro masking effect in an oxide etch using one or more other halocarbons or similar compounds such as those mentioned in the background section in addition to or in place of $CHF_3$.

After loading the substrate and pumping the system down, a first etch step is performed. The first etch step is performed in a flow of oxygen and $CHF_3$ in the currently preferred embodiment. In this first etch step, a very high oxygen flow rate compared with prior art processes is used. Typically, in the prior art, an oxygen flow rate of approximately 7 standard cubic centimeters per minute (SCCM) and a chloro/fluorocarbon flow rate of approximately 100–150 SCCM is used to etch oxide. The oxygen flow rate is limited to about 5% of the total flow by valume, because, as discussed above, the oxide/silicon selectivity drops as oxygen flow increases with respect to the chloro/fluorocarbon flow rate. It has been discovered, however, that a high oxygen flow rate in terms of both total flow and percentage of $O_2$ compared with the prior art, eliminates the micro masking effect. As mentioned in the background section, it is believed that the micro masking defects occur due to a localized crosslinking or polymerization on the BPSG surface. It is believed that the various chloro and fluoro carbon etchants used in the prior art cause or contribute to this polymer formation, and that this polymer masks the underlying BPSG during the etch, thus forming the micro masking defects 15 of FIG. 1. It is believed that the high $O_2$ flow rate of the present invention cures the micro masking effect because the $O_2$ percentage either prevents polymer formation, or because the oxygen effectively etches away any polymer formed.

In the currently preferred embodiment, an oxygen flow rate of 19 SCCM, approximately 15% of the total gas flow by volume is used. Also, in the currently preferred embodiment, the flow rate of $CHF_3$ is in the range of approximately 100–150 SCCM, the pressure in the etch chamber is in the range of approximately 40–50 mTorr, and the RF power is in the range of approximately 1500–2200 W. This etch is a timed etch, and is carried out for 9 minutes for a BPSG layer with a nominal thickness of 1.1 μ. The parameters given above may need to be optimized depending upon the etch system used and the characteristics of the layer being etched, including type of oxide (e.g., thermal, or deposited), the composition of the oxide (e.g., pure oxide, BPSG, or PSG), and the thickness of the layer to be etched. However, to eliminate micro masking, the $O_2$ flow must remain high. In the currently preferred embodiment, 19 SCCM oxygen flow is used during the first step. Generally, the oxygen flow should be above approximately 15 SCCM in processes using approximately 100–150 SCCM of, for example, $CHF_3$. As a further general guideline, for processes using a greater or lesser flow of etchant gasses or for processes using a plurality of etchant gasses in addition to oxygen, the oxygen flow should be approximately 10% or greater of the total flow by volume to eliminate the micro masking effect. Also, since the oxide/silicon selectivity decreases with increasing oxygen flow, the oxygen flow should be no higher than is necessary to eliminate micro masking.

The first etch is designed to remove the bulk of the BPSG layer 26 of FIG. 2 from all unmasked regions such as regions 28 of FIG. 2 as well as from other unmasked regions such as the large open sites discussed earlier. Generally, it is desirable that some oxide remain on the contact regions after the first etch step to ensure that the first etch step does not etch the underlying silicon.

Following the first etch step, a second etch step as shown in FIG. 3 is performed. The second etch step is performed immediately after the first etch step without removing the substrate from the etch system and without opening the system to atmospheric pressure. In the currently preferred embodiment, the second etch step is performed in a flow of oxygen and $CHF_3$. In the second step, the $O_2$ flow is much lower than the $O_2$ flow in the first step, in order to provide high oxide to silicon selectivity, since at this point some silicon may be exposed. The second step removes the remaining BPSG layer 26 from the exposed regions and is essentially an overetch to ensure complete removal of oxide layer 26 from all unmasked regions. In the currently preferred embodiment, the second etch step is a timed etch and is carried out for a time of approximately 12 minutes. Also in the currently preferred embodiment, the second etch step uses an $O_2$ flow rate in the range of approximately 7-10 SCCM, a $CHF_3$ flow rate in the range of approximately 100-150 SCCM, a pressure in the range of approximately 40-50 mTorr, and an RF power in the range of approximately 1500-2200 W. Following the second etch step, the substrate is removed from the etch system.

Figure 4:
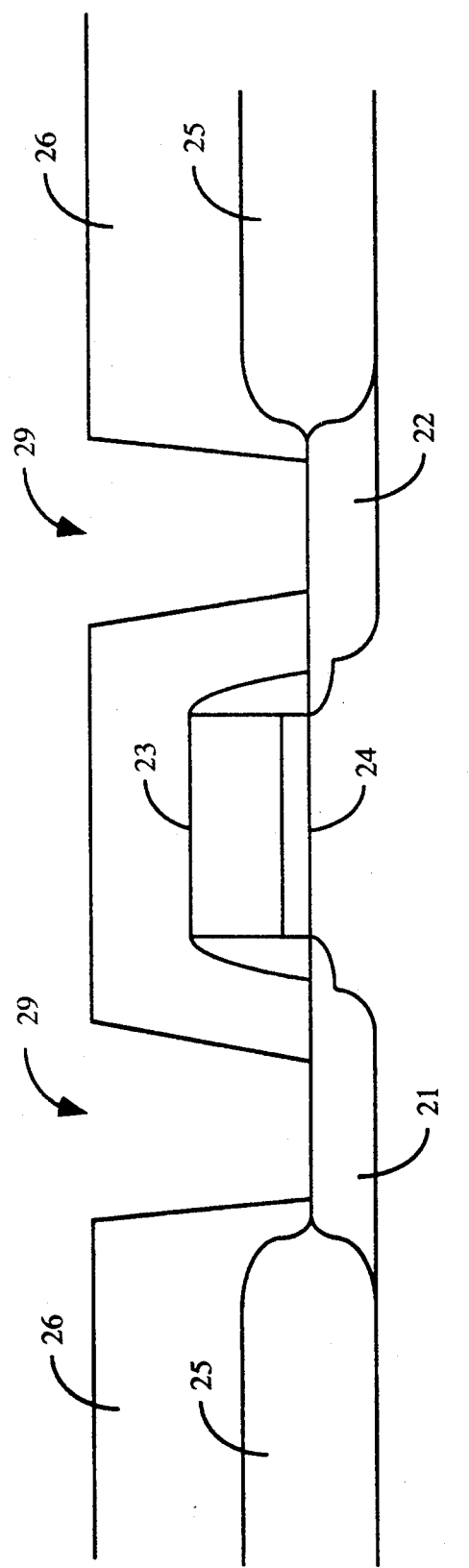
FIG. 4 shows the structure of FIG. 2 after the process of the present invention has been performed.

After the 2 step etch process described above, and after the removal of the photoresist mask, the structure of FIG. 2 appears as shown in FIG. 4. As can be seen, contact openings 29 have been etched through BPSG layer 26 over source 21 and drain 22. At this point, a metalization step as described in the background section can be performed to make electrical connection to active regions such as source 21 and drain 22.

Figure 1:
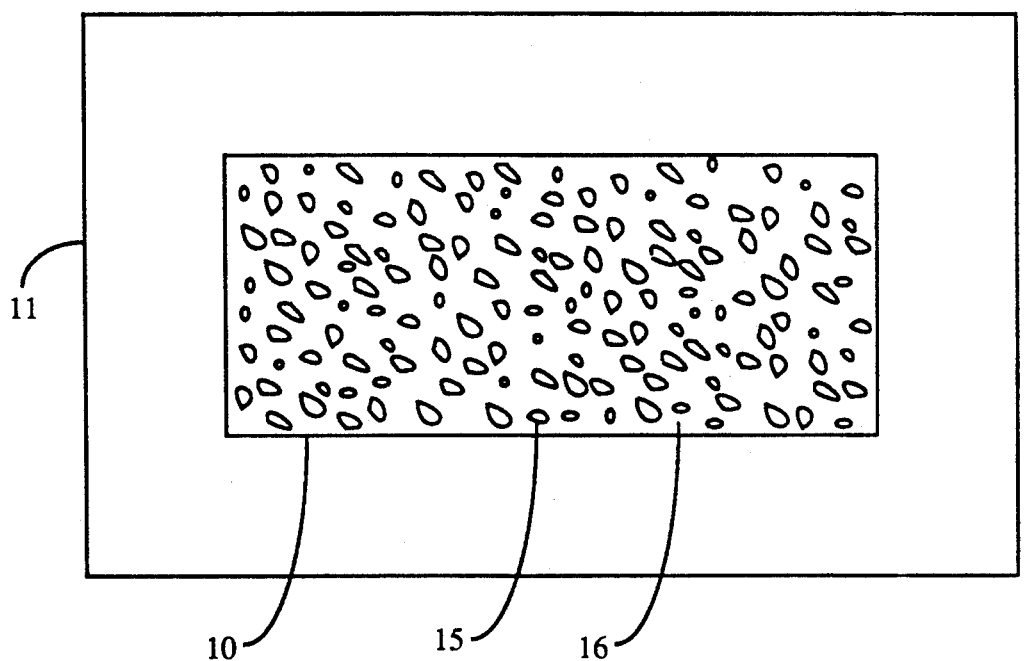
FIG. 1 shows a top view of a large open site on a semiconductor substrate after a prior art etch process.
Figure 5:
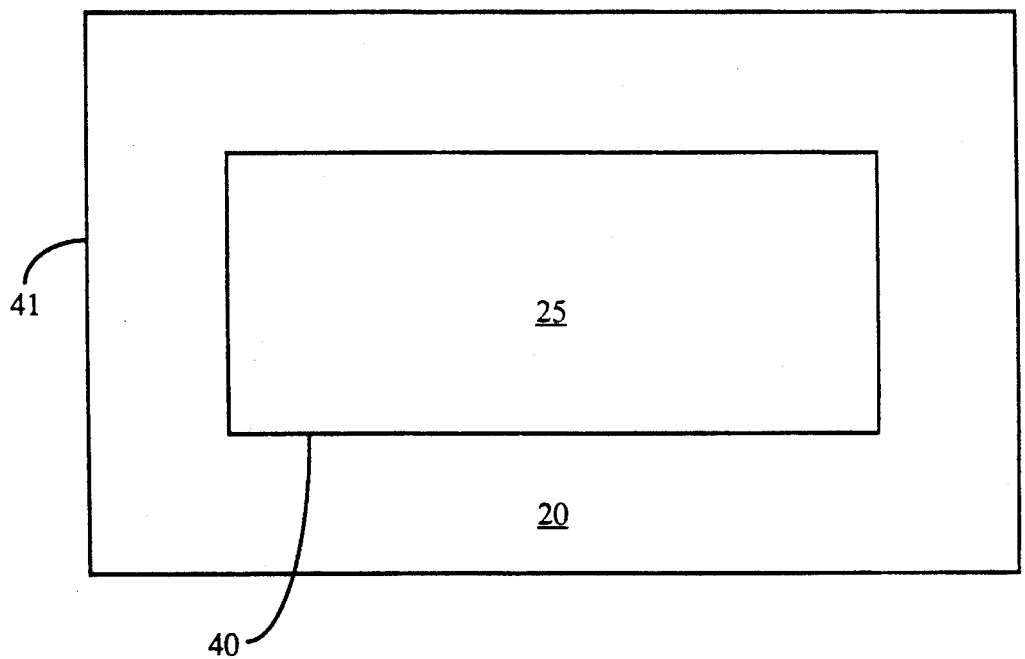
FIG. 5 shows a top view of a large open site on a semiconductor substrate after the process of the present invention has been performed.

FIG. 5 shows the top view of a large open site after the above described etch similar to the site shown in FIG. 1 after a prior art etch process. In FIG. 5, the outer region 41 has been masked during the etch step, so that BPSG layer 26 remains un-etched in this region. In the inner region 40, BPSG layer 26 has been completely etched away, and a portion of oxide layer 25 is exposed. Because the etch process of the present invention includes an overetch, some of oxide layer 25 has been etched away in the inner region 40. Currently, the overetch is approximately 50%, so that approximately 2,500 Å of oxide layer 25 is removed in the region 40. The overetch varies from one region to another due to differences in the thickness of BPSG layer 26. As can be seen in FIG. 5, micro masking has not occurred, and no micro masking defects such as micro masking defects 15 of FIG. 1 of the prior art process exists in the inner region 40 in the present invention.

As will be appreciated, many variations can be made to the currently preferred embodiment shown in FIG. 3 while remaining within the spirit and scope of the present invention. For example, if overetch of silicon is not a concern, a one step etch process with high $O_2$ flow can be used to etch an oxide layer without micro masking. Or, other chloro and/or fluorocarbons can be used in addition to or in place of $CHF_3$. The main consideration is that the $O_2$ flow rate is high, above approximately 10% by volume of the total gas flow. As a further alternative, more than 2 etch steps can be used with, for example, a gradual reduction in oxygen flow.

Thus, a novel process which can reliably etch an oxide layer, for example, a contact etch of a BPSG layer, has been described. In the present invention, no micro masking occurs, allowing for conventional analytical measurement of etch rate and, therefore, on-line monitoring of the etch process.

What is claimed is:

1. A process for etching an oxide layer during the fabrication of a device on a semiconductor substrate comprising the steps of:
providing said semiconductor substrate having said oxide layer; and
performing an etch in a flow of a mixture of gases comprising a halogen containing species and $O_2$, wherein said flow of said $O_2$ is equal to or greater than 15 SCCM and wherein said flow of said $O_2$ is equal to or greater than 10% by volume of the total gas flow.

2. The process as described in claim 1 wherein said halogen containing species is $CHF_3$.

3. The process as described in claim 2 wherein said flow of said $O_2$ is in the range of approximately 15-25 SCCM and said flow of said $CHF_3$ is in the range of approximately 75-150 SCCM.

4. The process as described in claim 2 wherein said oxide layer comprises BPSG.

5. The process as described in claim 3 wherein a surface comprising silicon underlies said oxide layer to be etched in at least some regions, said process exposing said surface comprising silicon in one or more of said at least some regions.

6. The process as described in claim 4 wherein a surface comprising silicon underlies said oxide layer to be etched in at least some regions, said process exposing said surface comprising silicon in one or more of said at least some regions.

7. A process for etching an oxide layer during the fabrication of a device on a semiconductor substrate comprising the steps of:
providing said semiconductor substrate having said oxide layer;
performing a first etch in a first flow of a first mixture of gases comprising a first halogen containing species and $O_2$; and
performing a second etch in a second flow of a second mixture of gases comprising a second halogen containing species and $O_2$, wherein said flow of said $O_2$ in said first mixture is greater than said flow of said $O_2$ in said second mixture.

8. The process as described in claim 7 wherein said first and said second halogen containing species are $CHF_3$.

9. The process as described in claim 8 wherein said flow of said $O_2$ in said first etch is equal to or greater than 15 SCCM and wherein said flow of said $O_2$ is equal to or greater than 10% by volume of the total gas flow.

10. The process as described in claim 8 wherein the flow of $O_2$ in said first mixture of gases is in the range of approximately 15-25 SCCM, the flow of $O_2$ in said second mixture of gases is in the range of approximately 5-15 SCCM, and the flow of $CHF_3$ in said first and said second mixture of gases is in the range of approximately of 75-150 SCCM.

11. The process as described in claim 8 wherein said oxide layer comprises BPSG.

12. The process as described in claim 9 wherein said oxide layer comprises BPSG.

13. The process as described in claim 8 wherein a surface comprising silicon underlies said oxide layer to be etched in at least some regions, said process exposing said surface comprising silicon in one or more of said at least some regions.

14. The process as described in claim 11 wherein a surface comprising silicon underlies said oxide layer to be etched in at least some regions, said process exposing said surface comprising silicon in one or more of said at least some regions.

15. The process as described in claim 12 wherein a surface comprising silicon underlies said oxide layer to be etched in at least some regions, said process exposing said surface comprising silicon in one or more of said at least some regions.

16. A process for forming a contact opening through an oxide layer during the fabrication of a device on a semiconductor substrate, comprising the steps of:
   providing said substrate with said oxide layer;
   forming a mask on said substrate to expose said oxide layer in regions where said contact opening is to be formed;
   performing a first etch in a flow of a first mixture of gases comprising a first halogen containing species and $O_2$;
   performing a second etch in a flow of a second mixture of gases comprising a second halogen containing species and $O_2$ wherein said flow of said $O_2$ in said first mixture is greater than said flow of said $O_2$ in said second mixture; and
   removing said mask.

17. The process as described in claim 16 wherein said first and said second halogen containing species are $CHF_3$.

18. The process as described in claim 17 wherein said flow of said $O_2$ in said first etch is equal to or greater than 15 SCCM and wherein said flow of said $O_2$ is equal to or greater than 10% by volume of the total gas flow.

19. The process as described in claim 17 wherein the flow of $O_2$ in said first mixture of gases is in the range of approximately 15-25 SCCM, the flow of $O_2$ in said second mixture of gases is in the range of approximately 5-15 SCCM, and the flow of $CHF_3$ in said first and said second mixture of gases is in the range of approximately of 75-150 SCCM.

20. The process as described in claim 17 wherein said oxide layer comprises BPSG.

21. The process as described in claim 18 wherein said oxide layer comprises BPSG.

22. The process as described in claim 16 wherein a surface comprising silicon underlies said oxide layer to be etched in at least some regions, said process exposing said surface comprising silicon in one or more of said at least some regions.

23. The process as described in claim 20 wherein a surface comprising silicon underlies said oxide layer to be etched in at least some regions, said process exposing said surface comprising silicon in one or more of said at least some regions.

24. The process as described in claim 21 wherein a surface comprising silicon underlies said oxide layer to be etched in at least some regions, said process exposing said surface comprising silicon in one or more of said at least some regions.

25. The process as described in claim 16 wherein said contact opening has a diameter of 1.0 micron or less.

26. The process as described in claim 17 wherein said contact opening has a diameter of 1.0 micron or less.

27. The process as described in claim 18 wherein said contact opening has a diameter of 1.0 micron or less.

28. The process as described in claim 19 wherein said contact opening has a diameter of 1.0 micron or less.

* * * * *